United States Patent [19]

Lynch

[11] 3,780,433

[45] Dec. 25, 1973

[54] A METHOD OF MAKING AN ELECTRICAL CONNECTION USING A COINED POST WITH SOLDER STRIPE

[75] Inventor: James Edward Lynch, Harrisburg, Pa.

[73] Assignee: AMP Incorporated, Harrisburg, Pa.

[22] Filed: May 1, 1972

[21] Appl. No.: 248,964

[52] U.S. Cl. .................... 29/628, 29/629, 29/630 D, 339/17 C, 339/217 R

[51] Int. Cl. .................... H01r 43/00

[58] Field of Search .................... 29/628, 625, 629, 29/630 R, 630 B, 630 D, 474.4, 482, 501, 502; 339/17 C, 217 R

[56] References Cited

UNITED STATES PATENTS

| | | | |
|---|---|---|---|
| 3,591,922 | 7/1971 | Pardee | 29/626 |
| 3,496,629 | 2/1970 | Martucci et al. | 29/502 |
| 3,474,521 | 10/1969 | Schwenn | 29/628 |

*Primary Examiner*—Charles W. Lanham
*Assistant Examiner*—James R. Duzan
*Attorney*—William J. Keating et al.

[57] ABSTRACT

A connector post or pin is disclosed which is particularly suitable for use with printed circuit board assemblies. The post includes a coined portion which is designed to permit the pin to be easily inserted into holes of a predetermined size in printed circuit boards, and to increase the quality of a solder joint between the post and the printed circuit board. A solder stripe is placed on each post in the coined region to facilitate soldering of the posts to conductive portions of the printed circuit board. The posts are attached in groups to break-away carrier strips to aid in the rapid assembly of large numbers of posts to printed circuit boards. The posts may also include provisions for coupling them to multilayered printed circuit assemblies. A method of fabricating the coined post is also disclosed which converts a post with normally an interference fit in a printed circuit board aperture to a post which is freely received in the aperture together with masses of solder adhered to said post.

2 Claims, 12 Drawing Figures

A METHOD OF MAKING AN ELECTRICAL CONNECTION USING A COINED POST WITH SOLDER STRIPE

BACKGROUND OF THE INVENTION

1. Field Of The Invention

This invention relates generally to connector posts, and more particularly to a coined, pre-soldered connector post, and to a method of manufacturing a coined pre-soldered connector post.

2. Description Of The Prior Art:

As is well known to those skilled in the art, one of the most important problems facing the electronic industry is that of rapidly, precisely manufacturing printed circuit assemblies. More particularly, a most difficult problem has been that of rapidly and securely coupling a large number of conductor posts to printed circuit boards.

Many improvements and technological developments have been made in the past in an effort to simplify the assembly of contact posts and printed circuit boards, and to improve the electrical and structural interconnections between the contact posts and printed circuit boards. However, each such advance in the technology has created new problems to be solved. For example, printed circuit boards are generally drilled or punched to form a plurality of holes in which connector posts are to be mounted. The holes were then lined with plating of conductive material, such plating being selectively continuous or selectively discontinuous as desired with plated circuit paths on the printed circuit boards. Originally, connector posts of a generally rectangular or square cross-sectional configuration were formed such that the posts were slightly larger than the plating lined holes in the printed circuit board. The posts were then forced into the holes in the printed circuit board to form a friction or interference fit. The corner edges of the posts were relied upon to slice through the plating internally of the holes to provide a metal-to-metal contact between the posts and the internal lining of the holes.

The connector posts thus were force fitted into plated-through holes in the printed circuit board, and solder was manually applied to the connector posts at either side of the plated-through holes in which they were positioned. However, it was found that the solder often failed to flow into the hole to firmly secure the connector posts in place. This proved to be a rather serious problem, since the resultant solder joints were often imperfect, including gaps and cracks in many cases. Thus, unless a substantial quantity of solder flowed into the hole, to surround the connector post and fill the gaps in the conductive plating within the hole, a poor electrical contact was formed.

In order to reduce the severity of this problem, and also to eliminate the time and degree of care needed for manually soldering each individual connector post, pre-soldered posts were introduced. Each pre-soldered post included a stripe or band of solder which was placed on the post before the post was inserted into a hole in a printed circuit board. Thus, after all of the desired pre-soldered posts were inserted into the printed circuit board, all posts could be heated simultaneously by a suitable means, causing the solder on the posts to melt and form a joint with the conductive plating on the interior portions of the holes in the printed circuit board. Reliable solder joints were obtained since substantial quantities of solder, adhered to the posts, were located internally of the printed circuit board apertures. Thus, upon melting the solder,solder joints were created internally of the apertures. In the prior art, solder masses were applied to the posts after the posts had been inserted in the apertures. It was difficult to introduce sufficient solder into the apertures in order to create the desired solder joints. It was also difficult to inspect whether sufficient solder masses did in fact flow into and fill the apertures. Thus, by adhering solder to the posts in stripes or bands,the solder could be inserted in the interior of the apertures,without the need for the additional step of later applying the solder to the posts in the apertures, and without the experienced difficulties of obtaining good solder joints by that latter step.

Accordingly, it is important to adhere as large a mass of solder as possible to the posts in order to obtain sufficient solder internally of the apertures to make the desired solder joints. It is possible to build-up the solder in thick layers on the posts. However, thick layers are easily broken off or scraped off the post during insertion. Also, during deposition of the solder in a molten state on the posts, the solder tends to agglomerate and flow away from the sharp corner edges of the post. Also, the deposited solder tends to taper in thickness adjacent the sharp edges which further limits the masses of solder that will adhere to the posts. The present invention is directed to fabrication of the posts by coining in order to blunt the sharp edges only where the solder masses are to be deposited. Coining thus eliminates the sharp edges, allowing solder to adhere to the less-sharp corners formed during coining. Also, coining beyond mere blunting of the sharp edges may be done in order to create a polyhedral cross-section of the post. This creates more planar surface area on the posts to which the solder may adhere. Thus coining provides two separate advantages, coining merely to eliminate the sharp edges or coining to create additional surface area of the posts.

A further advantage of the invention is realized upon coining existing posts designed for interference fit in printed circuit board apertures. By coining the posts to the extent that a polyhedral cross-section is obtained, the posts' sharp edges are removed. This defeats the interference fit desired of the posts, since sharp edges are no longer available to slice into the lining of the printed circuit board apertures. At first impression, it would appear that coining the posts would make them smaller and then useless for their desired functions of interference fits in the apertures. However, upon depositing solder on the posts, the solder adheres to the posts and thus enlarges the apparent cross-section of the posts. Upon insertion of the posts in the printed circuit board apertures, the adhered solder bands will form the desired interference fit with the plating lining of the apertures. Upon melting or heating to reflow the solder bands good solder joints internally of the apertures will be formed. The posts themselves will not make an interference fit in the apertures, since they have been made smaller by coining. However, the interference fit function is accomplished by the solder bands; and upon reflow, the resultant solder joints positively retain the posts in the printed circuit board more readily than the interference fit. The solder joining technique, together with the coined posts, also eliminate the often experienced strain and damage to the printed circuit boards when prior art posts were forcibly inserted into the board to make the desired interference fits. If there is any strain in the printed circuit board occasioned by insertion of the solder banded and coined posts, the solder upon heating will flow away from the strain areas, thereby relieving the strain.

As another advantage, the coining and solder banding operations can be used to convert existing interference fit posts, thereby eliminating the need to destroy inventories of obsolete posts and the stamping dies used to make the obsolete posts when converting from an interference fit system to a solder banding and reflow system.

To speed the insertion of large numbers of connector posts into printed circuit boards, the break-away carrier strip was developed. According to this technique, a large number of connector posts were formed integral with a carrier strip. The entire group of connector posts could then be handled together, and all connector posts could thus be simultaneously inserted into holes in a printed circuit board. The carrier strip was then broken away, leaving the individual connector pins in place in the printed circuit board.

The development of both the pre-soldered connector post, and the break-away carrier strip greatly advanced the technology involved in mounting connector posts to printed circuit boards.

SUMMARY OF THE INVENTION

Accordingly, one object of this invention is to provide a novel connector post structure which insures a high quality electrical and mechanical interconnection between a connector post and a layer of conductive material secured to a printed circuit board.

Another object of this invention is to provide a novel coined connector post structure.

Yet another object of this invention is to provide a method of producing a novel connector post structure for use with printed circuit boards.

Another object of this invention is to provide a novel technique for assembling a plug connector device.

A still further object of this invention is to provide a novel connector post structure which is extremely simple to mount in a printed circuit board.

Yet another object of this invention is to provide a novel connector pin assembly which is exceptionally convenient for rapidly mounting a plurality of connector pins in a plurality of plated holes in a printed circuit board.

Briefly, these and other objects of the invention are achieved by providing a structure which includes a plurality of connector posts formed integral with a break-away carrier strip. Each connector pin includes at least one coined portion over which a stripe or band of solder is placed. Each of the pre-soldered connector posts is inserted into a plated hole in a printed circuit board, and heat is applied by a suitable means to the solder carried by each post. The coined portion of each connector post causes the solder to flow into each of the holes in the printed circuit board to form an ideal electrical and mechanical interconnection between the connector posts and the plated interiors of the holes in the printed circuit board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
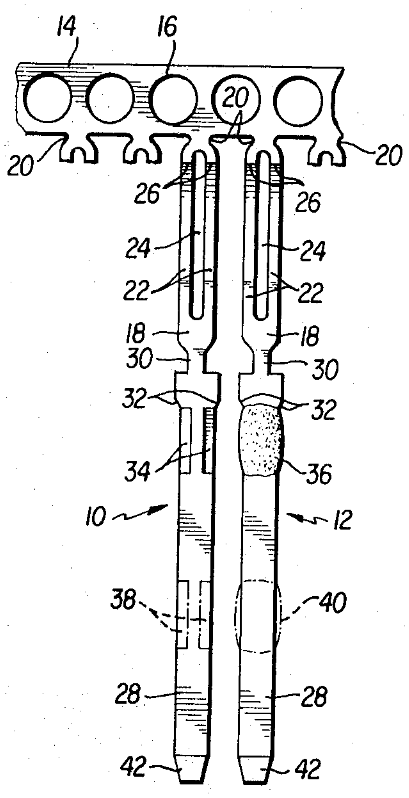
FIG. 1A is an illustration of a pair of connector posts coupled to a break-away carrier strip.

Referring now to the drawings, wherein like reference numerals designate identical or corresponding parts throughout the several views, and more particularly to FIG. 1A thereof, a preferred embodiment of the invention is illustrated as including a pair of connector posts 10 and 12 coupled to a break-away carrier strip 14. The connector posts 10 and 12 and the break-away carrier strip 14 are preferably formed from a single sheet of the same material, which is preferably a highly conductive metal such as copper, bronze or another suitable highly conductive metal alloy. The entire assembly may also be plated with nickel, silver or gold, as desired, to improve the conductivity of the connector posts. Although only two connector posts 10 and 12 are illustrated in FIG. 1A, it will be clear to those skilled in the art that virtually any number of connector posts may be formed integral with the break-away carrier strip 14.

The break-away carrier strip 14 includes a plurality of apertures 16 in order to minimize the amount of material included in the break-away carrier strip, since the break-away carrier strip 14 is eventually discarded. Each of the connector posts includes an upper portion 18, which is coupled through a reduced neck portion 20 to the break-away carrier strip 14. The upper portion 18 of each connector post includes a pair of legs 22 which are separated by an oval aperture 24. At the end of each leg 22 is a scored or punched groove 26, which forms the weakest mechanical link between each connector post and the break-away carrier strip 14. Thus, if the break-away carrier strip 14 is bent with respect to each connector post, the relatively weak groove 26 will give way, causing the breakaway carrier strip to separate from each of the connector posts.

When the connector strip 14 is separated from each of the connector posts, the legs 22 form a pair of tines, having an open ended, U-shaped opening between them. When viewed from the side, as in FIGS. 1B and 1C, the legs 22 are bent in a C-shaped curve. The legs 22 are thus shaped, and once broken away from carrier strip 14, form a connector grip. Thus,a conductor or thin printed circuit panel may be inserted between pairs of legs 22 to be frictionally engaged by the legs 22, as will be described in greater detail hereinafter.

Each connector post includes a lower portion 28 which is coupled to the upper portion 18 through a second neck portion 30. A pair of shoulders 32 are formed directly below the second neck portion 30 of each connector post, and extend outwardly on either side of each connector post.

The post is formed with either a square or rectangular cross-section. For clarity only the rectangular type of post will be discuseed. However, it is to be understood that the description applies equally to a square type post.

Figure 4:
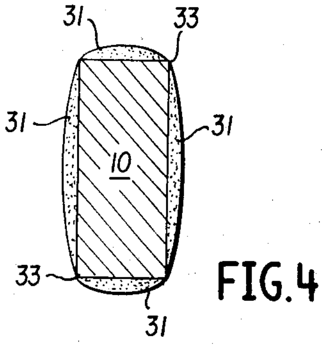
FIG. 4 is a sectional view of a post of rectangular cross-section provided with deposited solder.

As shown in FIG. 4, the rectangular post 10 is shown in section. A quantity of solder is deposited on the post in a band encircling the post. The solder is deposited on the post in a molten state and allowed to cool and adhere to the post. During deposition, the molten solder tends to agglomerate into spherical form, as is typical with the behavior of a liquid mass in a gas. Hence, the surface 31 of the deposited solder will be in an arcuate form and allowed to cool and solidify to that form. The molten solder has a affinity to agglomerate and thus recedes from the sharp corner edges 33 of the rectangular post. As a result, the solder thickness tapers acutely adjacent the edges. This tapering phenomenon is likely caused by the surface tension of the molten solder which limits the mass of solder which can be adhered to a post of given surface area between the sharp corner edges 33 of the post.

Figure 3:
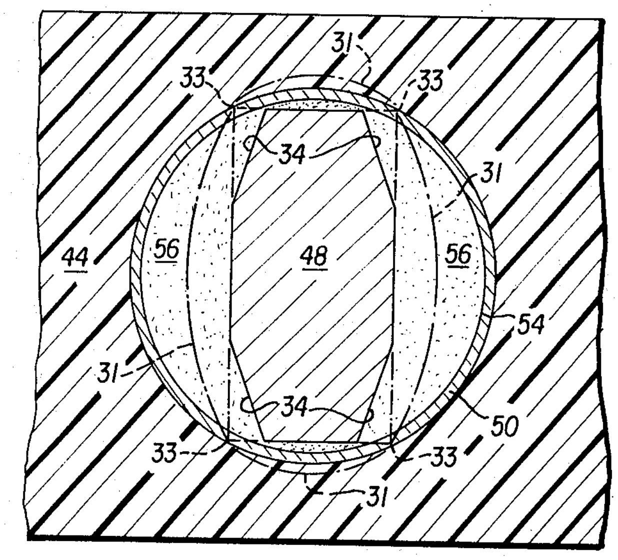
FIG. 3 is a sectional view taken along the line 3—3 of FIG. 2, illustrating a connector post inserted in an aperture of a printed circuit board.

FIG. 3 shows the rectangular post in phantom outline, inserted in an aperture 54 of a printed circuit board 44. If the post is fabricated for an interference fit, the sharp edges 33 will slice into the plating layer 50 lining the aperture 54 in order to hold the post with an interference fit in the aperture and to form a metal-to-metal contact between post and plating. In the prior art, solder was then applied to form a solder joint to mechanically and electrically connect the post to the plating. Soldering each post was time consuming and required hand soldering to correct insufficient joints. Since solder was externally applied, it was difficult to obtain a solder joint internally of each aperture. Also, the quality of a solder joint was difficult to determine. By inspection it would often appear that solder filled the aperture when, in fact, substantial voids were hidden inside the apparently filled apertures. When tested electrically, the solder joints appeared to support current flow. However, after vibration during use, the solder joints would fracture and the solder joint would fail subsequent electrical tests.

It was in response to the problems of time consumption and reliability of solder joints that the present invention was devised. To pre-deposit the solder in bands on the posts allowed the bands to be already located in the apertures upon reflowing the solder. This insured that the solder would fill the apertures to make a reliable and relatively void free joint. If the board were placed in stress upon insertion of the posts, the solder upon reflow, would flow away from the stressed portions of the board and act as a strain relieving feature. It was not practical to coat the entire post with solder, since the sharp edges of the post were required to permit electrical wiring by wire wrapping or clip-type terminations. Thus, to coat the entire post would require subsequent cleaning of the posts to remove excess solder. This involved another process step and also involved the disadvantage of removing solder from the desired joints as well as from the posts.

Figure 1B:
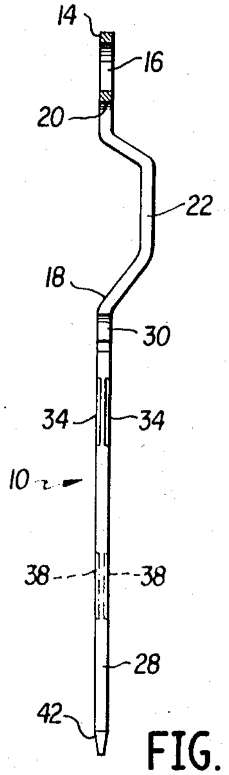
FIG. 1B is a side view of one of the connector posts illustrated in FIG. 1A.

Although the solder banding technique was practical in many applications, it was not practical when applied to existing prior art posts designed for an interference fit. As shown in FIG. 3, the deposited solder surface 31 was not accommodated in the aperture 54. The post took up excessive space in the aperture, such that the solder was sheared off in places upon insertion in the aperture. In other places, there was excessive room between the solder surface 31 and the aperture plating 50. The total mass of solder initially in the aperture was often insufficient to reflow and fill the entire aperture and form a void free joint. It was in response to this deficiency that resulted in the following modification of the post designed for interference fit. Thus, as shown in FIGS. 1A and 1B, immediately below the shoulders 32 are formed a plurality of coined portions 34. The cross-sectional configuration of each connector post in the area of the coined portions 34 is illustrated in FIG. 3. The coined portions 34 are preferably formed by a punching or stamping operation which effectively bevels a short length of all four corners of each connector post. The resulting cross-sectional configuration of the coined portion is clearly illustrated in FIG. 3, wherein it can be seen that the corners of the generally rectangular shaped connector posts are removed or beveled at the coined portions 34. The length along the post of each coined portion is preferably equivalent to the approximate thickness of the printed circuit board in which the connector posts are to be mounted and is generally much less than the total length of the connector post.

Figure 1C:
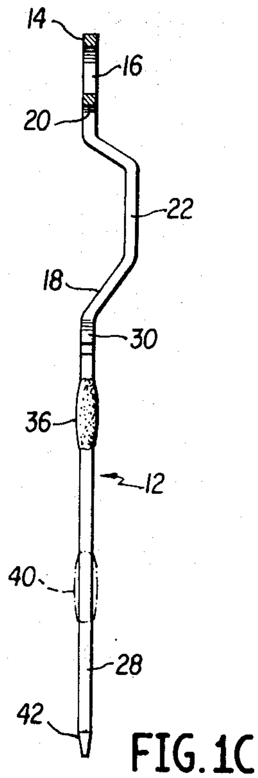
FIG. 1C is a side view of the other connector posts illustrated in FIG. 1A.

A solder stripe or band 36 is placed around the coined portions 34 of each connector post, as illustrated more clearly with reference to the connector post 12 of FIGS. 1A and 1C. Thus, it will be clear that the connector posts 10 and 12 respectively illustrate the apparatus of the present invention before and after solder is applied to the coined portions 34.

The solder stripe or band 36 is placed on each connector post by suitable depositing techniques. However, the coined portions 34 aid in positioning the solder stripe 36 on each connector post. In addition, the coined portions 34 tend to cause the molten solder as it is applied to confine itself to the coined areas, rather than to flow outwardly along the length of the connector posts. However, the coined portions 34 permit the deposition of more solder than could be used if there were no coined portions. This is true since the solder stripe or band 36 fills in the coined areas when it is applied to each connector post, yet a connector post with coined portions, even though it carries an enlarged solder stripe or band 36, still fits into holes of conventional diameters drilled or punched in printed circuit boards. More specifically, the portions of the post removed by coining are replaced by additional volumes of solder adhered to the post. Such portions 34 also provide more planar surface area to which the solder may adhere, than provided by the uncoined post. This allows solder to adhere to the increased surface area and thus results in an increase in the total mass of solder which will adhere to the coined posts by comparison with the uncoined posts. As shown in FIG. 3, the sharp corner edges of the post are replaced by the relatively blunt corner edges defining the coined planar surfaces. The solder readily adheres to the blunt edges as well as to the portions 34 to form a continuous multiplanar surface wetted by the solder. The total mass of solder 56 which adheres to the continuous multiplanar surface is greater by comparison with the solder mass adhered to the planar surface of the uncoined post as shown in phantom outline at 31 in FIG. 3. Thus, deposition of the solder on the rectangular post allows only a thickness of solder shown at 31. However, by increasing the continuous surface area to which the solder can adhere, such as by coining portions 34, solder deposited according to the same deposition techniques will adhere in a greater thickness than expected from deposition on a rectangular post.

As shown in FIG. 3, the increased solder mass of the coined post assures that sufficient solder is located internally of the aperture 54 to assure a void free solder joint upon reflowing the solder. As a further advantage, it is the solder 56 which makes the interference fit in the aperture 54. This makes sure there is solder contact with the lining 50 such that upon reflow the solder will wet and adhere to the lining. As a further feature, wetting of the lining and the inserted post by the solder creates a capillary action which draws molten solder into the aperture to assure that the aperture becomes filled with solder.

Where it is desired that a plurality of printed circuit boards should be coupled together, additional coined areas, as indicated by dashed lines at 38, may be added to each connector post. Clearly, several additional coined areas 38 may be added, where necessary. Similarly, additional solder stripes or bands 40 may be positioned in all additional coined areas 38. Thus, each connector post may be presoldered in a plurality of areas to permit rapid coupling to either a plurality of stacked printed circuit boards, or to a single multi-layer printed circuit board.

Each connector post terminates in a tapered tip 42, which is provided for the purpose of facilitating insertion of each connector post into holes provided in printed circuit boards.

The connector posts described above may be manufactured according to several techniques. However, the preferably manufacturing technique is to punch out of a metal sheet a substantial length of carrier strip to which a large number of connector posts are attached. The break-away grooves 26 may be punched into the carrier strip assembly at the same time that the assembly itself is being stamped, or they may be punched at a later time. The coined portions 34 are then stamped or punched onto each connector post. The entire assembly may then be plated with a suitable conductive material, if so desired. A solder stripe is then applied along the entire row of connector posts, so that a band of solder remains in the coined areas of each connector post. The combined break-away carrier strip and connector post is then ready for installation in a printed circuit board.

In the process of installation, the entire row of connector posts coupled to a carrier strip are simply inserted into an appropriately punched or drilled row of holes in the printed circuit board until the shoulder portions 32 of each post abut the board. Heat is applied in a suitable manner to the entire row of connector posts, to cause the solder bands 36 to flow. Once the solder has cooled, and the connector posts are firmly in place, the carrier strip 14 is broken away and discarded, leaving all of the connector posts firmly emplaced in the printed circuit board.

Figure 2:
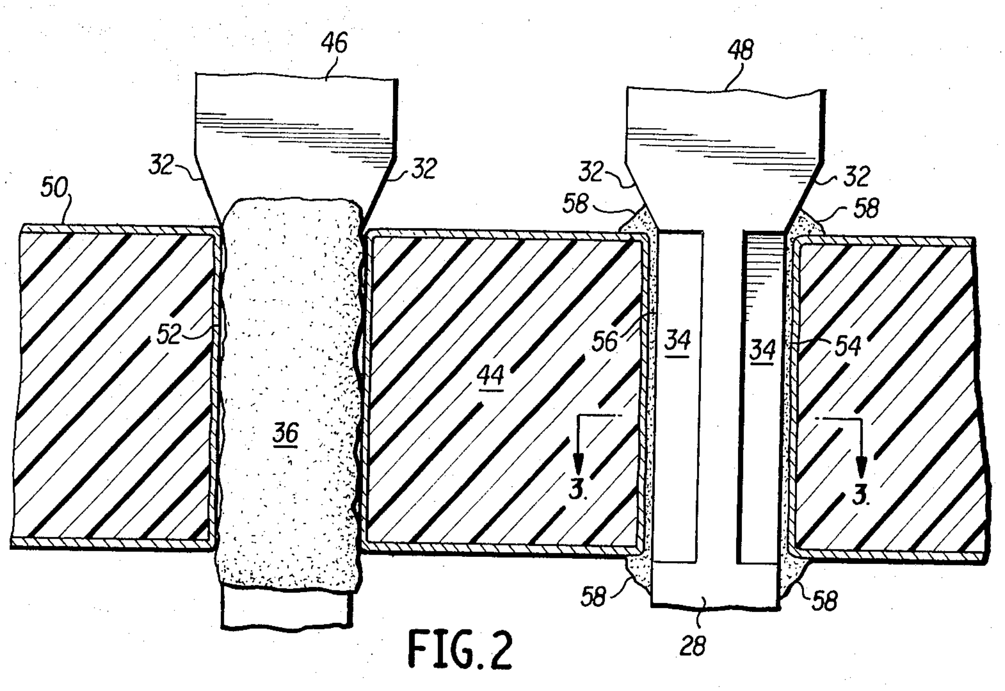
FIG. 2 is a partially cut-away side view of two connector posts mounted in a printed circuit board, before and after they are soldered into position.

Referring now to FIG. 2, the manner in which each connector post is secured to a printed circuit board is illustrated in more detail. A section of printed circuit board 44 is shown with a pair of connector posts 46 and 48 inserted through it. The printed circuit board 44 is plated with a layer of conductive material 50. The conductive material 50 is plated through a pair of apertures 52 and 54 in the printed circuit board. As illustrated in FIG. 2, the conductive material plated in the apertures 52 and 54 is somewhat rough and uneven, and may include small cracks and discontinuities.

The connector post 46 is shown inserted into the aperture 52 prior to heating, with the solder band 36 in position. As illustrated, the connector post 46 is inserted into the aperture 52 until the shoulder portions 32 of the connector post abut the printed circuit board 44. Heat is then applied to the connector post by a suitable means, such as dipping the entire printed circuit board structure into a heated fluid, to cause the solder band 36 to flow. As the solder band 36 melts, it tends to agglomerate to itself. This fact, combined with capillary action, in the space left in each aperture between the printed circuit board and the corresponding post, causes the solder to be attracted into the aperture in the printed circuit board. The result of the solder flow into a plated-through aperture is shown around the connector post 48. As illustrated, the solder band 36, when melted, is attracted into the aperture and may completely fill the aperture 54 in the printed circuit board and fills all of the apertures, cracks and discontinuities in the layer of conductive material plated through the interior of the aperture 54. Solder fillets 58 may be formed at the juncture of the printed circuit board 44 and the connector post 48 above and below the printed circuit board, due to the tendency of the solder to agglomerate to itself and to the capillary action.

As illustrated in FIG. 3, the solder substantially surrounds the connector post 48, holding it firmly in place in the aperture 54 in the printed circuit board 44. The coined portions 34 reduce the volume of the connector post 48 within the aperture 54.

It should be pointed out that the coined portions 34 provide additional spacing within each of the apertures in the printed circuit board to permit a more rapid and positive flow of the solder into the apertures due to capillary action and due to the natural tendency of the solder to agglomerate to itself. Thus, in addition to permitting more solder to flow into the apertures, than would be the case if there were no coined portions, the coined portions also speed and improve the flow of solder into the apertures.

In assembling a plurality of connector posts to the printed circuit board, a problem that existed in the past was that of insuring that all of the connector posts would be precisely aligned. This problem is substantially eliminated by the present invention, since all of the connector posts can be easily aligned by simply leaving them connected to the break-away carrier strip 14 and aligning the carrier strip properly. The individual connector posts are then soldered in place simply by heating them, and the solder is allowed to harden. The carrier strip 14 is then broken away, and the connector posts are left firmly soldered to the printed circuit board in perfect alignment.

Coining areas of the posts removes the sharp corner edges thereof and thus eliminates an interference fit of the posts in the apertures of the printed circuit board. Thus, without metal-to-metal contact between the posts and plating lining, the solder upon reflow is able to wet the entire surface of the lining and fill any voids therein, especially voids created by slicing when the uncoined lengths of the posts are passed through the apertures. Slicing of the lining can be eliminated if desired by fabricating posts of smaller cross-section and providing solder bands selectively thereon. Then, the interference fit of the solder bands in the plating lined apertures will mechanically retain the smaller cross-section posts in place until solder reflow establishes permanent solder joints. However, the coining operation herein described permits adapting the interference fit posts for solder banding and thus utilizes what would otherwise be discarded inventory of interference fit posts and stamping dies used for fabricating the posts.

Figure 5:
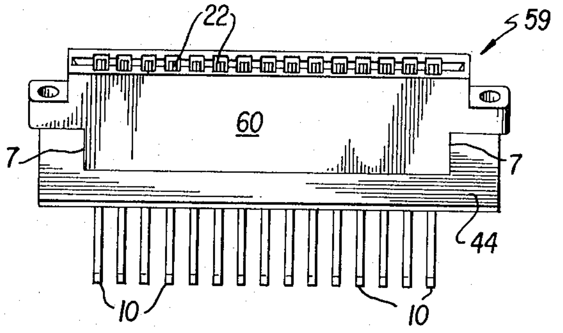
FIG. 5 is a perspective illustration of a plug connector assembly according to the instant invention.

Referring now to FIG. 5, a plug connector assembly 59 which includes the pre-soldered connector posts described above is illustrated in perspective. The plug connector assembly 59 includes a plug housing 60, which may be constructed of a suitable insulating material such as a conventional plastic. The plug housing 60 includes an interior structure which is adapted to permit a double row of pre-soldered connector posts 10 to be mounted within the plug housing 60. The pre-soldered connector posts 10 may be secured to the plug housing 60 by means of a variety of mechanical mounting techniques. For example, the connector posts 10 may be simply interference fitted into suitably sized apertures in the plug housing 60. Alternatively, the connector posts may be provided with a twist tab (not shown) which permits them to be secured within the plug housing 60.

Figure 6:
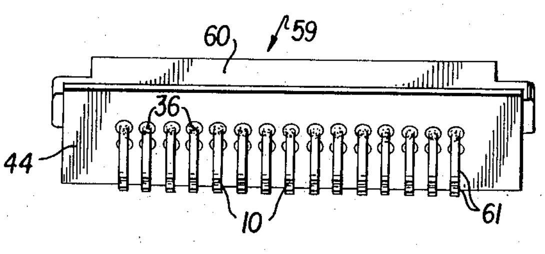
FIG. 6 is a perspective illustration of the plug connector assembly illustrated in FIG. 5 showing the bottom portion thereof.

The individual connector posts 10 are inserted into the plug housing 60 in double rows, as set forth above. Thus, the connector posts 10 which protrude through the bottom of the plug housing 60 are arranged in a paired fashion. Exemplary pairs of connector posts 10 are designated by the numeral 61 in FIG. 6. The connector posts 10 comprising each pair 61 are positioned in the plug housing 60 in a back-to-back relationship. In other words, referring to FIGS. 1B and 1C, the leg portions 22 of the two connector posts 10 forming a pair 61 are juxtaposed to one another, so that the C-shaped curves formed by the leg portions 22 of the individual connector posts open in opposite directions. This arrangement provides a resilient connector comprised of a plurality of closedly spaced tines having an angled opening or mouth portion designed to receive a male connector. Thus, a plurality of male connectors can be inserted into the top portion of the plug housing 60, such that the male connectors engage the various legs 22 of the connector ports 10 mounted in the plug housing.

In assembling the plug connector assembly 59, the pre-soldered connector posts 10 may first be mounted in the plug housing 60, while still attached to the break-away carrier strip 14. The carrier strip 14 may then be broken away and discarded, since the pre-soldered connector posts 10 are then firmly emplaced in the plug housing 60. The pre-soldered connector posts 10, mounted in the plug housing 60, may then be inserted through a suitable plurality of apertures in the printed circuit board 44. The entire assembly may then be securely fastened together by heating the solder strip or band 36 on each of the connector posts 10.

Figure 7:
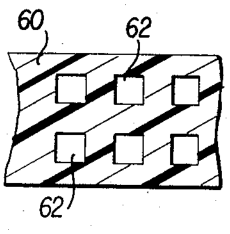
FIG. 7 is a partial cross-sectional view of the plug connector assembly of FIG. 5 taken along the line 7—7 of FIG. 5.
Figure 8A:
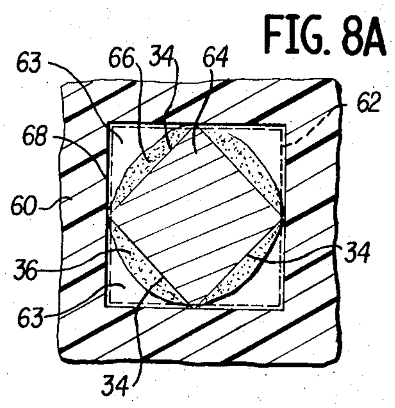
FIG. 8A is a magnified view of a portion of the plug connector shown in FIG. 7.
Figure 8B:
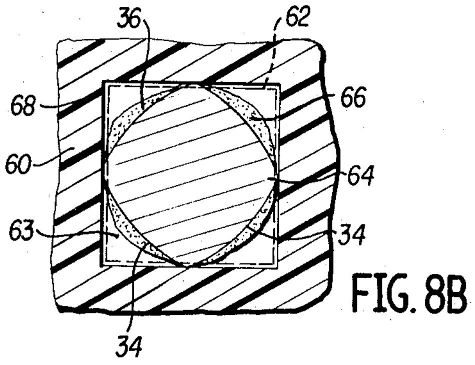
FIG. 8B is a magnified view as in FIG. 8A showing an alternative pin structure; and, FIG. 8C is a magnified view as in FIG. 8B showing another alternative structure.

The manner in which the coined structure described hereinabove facilitates the construction of the plug connector assembly 59 is illustrated in more detail in FIGS. 7 and 8. In particular, FIG. 7 illustrates a cross-sectional view of a portion of the plug housing 60. As shown, the plug housing 60 includes a plurality of apertures 62 in which the connector posts 10 are to be inserted. Although the apertures 62 illustrated in FIG. 7 are of a square configuration, it will be understood that various other aperture configurations are contemplated within the scope of the present invention.

In assembling the connector posts 10 and the plug housing 60, the solder stripe or band 36 on each connector post 10 must pass completely through one of the apertures 62 in the plug housing 60. Nevertheless, the apertures 62 must preferably be of essentially the same dimensions as the cross-section of each connector post 10, in order that the connector posts may be securely held within the apertures 62. The problem created by the need for having a snug fit between the connector posts and the apertures 62, and yet permitting the solder stripes or bands 36 carried by each of the connector posts to pass through the apertures 62 is solved by coining. For example, FIG. 8A illustrates a connector post 64 inserted through an aperture 62 in the plug housing 60. The cross-sectional configuration of the connector post 64 is generally square, as illustrated by the dashed line 68. As shown, the square configuration of the connector post 64 interfits closely with the interior surface of the aperture 64. Clearly, if a solder band or stripe were positioned around the outer periphery 68 of the connector post 64, the solder carrying portion of the connector post would not pass through the aperture 62. However, as illustrated in FIG. 8A, the corner portions 63 of the connector post 64 are removed in the area where the solder band 36 is positioned. Thus, a plurality of coined edges 34 are created. Solder globules 66 adhere to the coined portions 34 of the connector posts 64 in the manner described hereinabove. That is, the solder mass is concentrated toward the center of each of the coined portions, and does not adhere to the edges between the coined portions. However, even the thickest portions of the solder globules 66 fit within the area defined by the aperture 62. Accordingly, when the edges of the connector post 64 are coined, the solder band 36 fits easily through the aperture 62, permitting easy assembly of the connector post 64 with the plug housing 60.

Figure 8C:
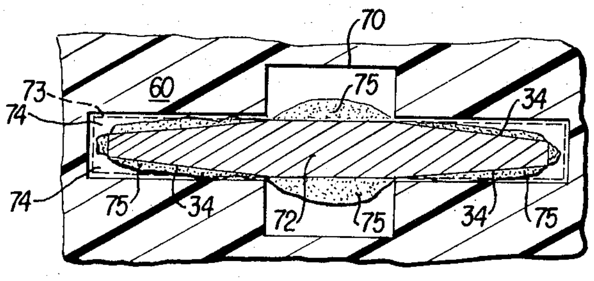

A similar structure is illustrated in FIG. 8C. However, in FIG. 8C, the coining is done in a different manner. That is, instead of stamping or punching the corners of the connector posts 70 in a diagonal manner, as in FIG. 8A, the corners of the connector post are punched leaving a curved outer surface on the coined area of the connector post 64. Again, extensive areas of the corner portions 63 are removed, furnishing room for the solder globules 66 within the apertures 62. It will be noted that the soldered portions of the connector posts 64 travel completely through the apertures 62, and are not positioned within the apertures 62. Thus, when the plug connector assembly 59 is in its fully assembled condition, the full cross-sectional area 68 of each of the connector posts 64 is positioned within the apertures 62. This permits a snug or interference fit between each of the connector posts and the edges of the apetrures 62 in the plug housing 60.

A different aperture and connector post configuration is illustrated in FIG. 8C. More particularly, an aperture 70 having a cruciform cross-sectional configuration is illustrated, and a connector post 72 of a generally rectangular configuration is positioned within the cruciform aperture 70. As shown, the connector post 72 has a rectangular cross-sectional configuration illustrated by the dashed line 73. However, in the solder carrying area of the connector post 72, the corner portions 74 of the connector post are removed, leaving coined surfaces 34. Again, solder globules 75 are deposited on the coined surfaces of the connector post 72, and on the remaining flat surfaces of the connector post. However, all of the solder globules fit easily through the cruciform aperture 70. Thus, the coined rectangular connector post 72 may be easily inserted through the cruciform aperture 70, even though it carries a band of solder.

It will, of course, be understood by those skilled in the art that apertures of many different cross-sectional configurations can be used in the plug housing 60. Similarly, connector posts of many different cross-sectional configurations can also be used in the plug connector assembly 59. Furthermore, the coining of the connector posts may be accomplished in various manners, so that the corner portions may be completely beveled off, or the corners of the connector posts may be rounded off, leaving the connector posts with a somewhat oval shaped outer periphery. However, no matter which alternative shape or style of coining is used. coining the connector posts in the areas of the solder strips 36 greatly facilitates assembly of the plug connector assembly 59.

Obviously, numerous modifications and variations of the present invention are possible in light of the above teachings. It is therefore to be understood that within the scope of the appended claims, the invention may be practiced otherwise than as specificially described herein.

What is claimed as new and desired to be secured by letters patent of the United States is:

1. A method of converting an interference fit electrical connection between an elongated post of polyhedral cross-section and sharp corner edges and a plating lined aperture provided in a printed circuit board, comprising:

coining a selected portion of said post to remove said sharp corner edges from said selected portion, depositing a mass of solder adhered to and encircling said selected portion in a band configuration, said coining step further including the step of forming generally planar surfaces on said selected portion of said post in place of said removed sharp corner edges, said solder adhered to and covering said planar surfaces, inserting said post in said plating lined aperture, registering said coined selected portion of said post in said plating lined aperture and creating an interference fit of said solder band in said plating lined aperture, and heating said solder band to reflow said solder and create a void free solder joint internally of said plating lined aperture and in substantial encircling relationship with said post, said solder joint filling voids and imperfections in the plating of said plating lined aperture and reflowing to relieve stresses in said printed circuit board.

2. The method of claim 1, and further including the step of:

initially slicing said plating of said plating lined aperture upon insertion of said post uncoined sharp corner edges in said aperture, said solder upon reflow filling the sliced portions of said plating lined aperture to create a void free solder joint fixedly retaining said post in said plating lined aperture.

* * * * *